(12) United States Patent
Tarui et al.

(10) Patent No.: US 8,809,969 B2
(45) Date of Patent: Aug. 19, 2014

(54) SEMICONDUCTOR DEVICE

(75) Inventors: Yoichiro Tarui, Chiyoda-ku (JP);
Atsushi Narazaki, Chiyoda-ku (JP);
Ryoichi Fujii, Chiyoda-ku (JP)

(73) Assignee: Mitsubishi Electric Corporation,
Tokyo (JP)

( * ) Notice: Subject to any disclaimer, the term of this patent is extended or adjusted under 35 U.S.C. 154(b) by 255 days.

(21) Appl. No.: 12/650,957

(22) Filed: Dec. 31, 2009

(65) Prior Publication Data

US 2010/0289110 A1    Nov. 18, 2010

(30) Foreign Application Priority Data

May 12, 2009 (JP) .................... 2009-115502

(51) Int. Cl.
*H01L 29/76* (2006.01)

(52) U.S. Cl.
USPC ............................ 257/409; 257/490; 257/495

(58) Field of Classification Search
USPC ................ 257/77, E23.01, 409, 488–495
See application file for complete search history.

(56) References Cited

U.S. PATENT DOCUMENTS

2003/0218220 A1   11/2003   Takahashi et al.
2008/0258153 A1*  10/2008   Yamamoto et al. ............ 257/77

FOREIGN PATENT DOCUMENTS

| DE | 103 02 628 A1 | 12/2003 |
|---|---|---|
| DE | 10 2004 057 792 A1 | 6/2006 |
| JP | 11-330456 | 11/1999 |
| JP | 2000-183366 | 6/2000 |
| JP | 2002-246611 | 8/2002 |
| JP | 2003-78138 | 3/2003 |
| JP | 2004-179511 A | 6/2004 |
| JP | 2007-227620 A | 9/2007 |
| JP | 2007-266123 A | 10/2007 |
| JP | 2008-270413 | 11/2008 |

OTHER PUBLICATIONS

Office Action issued Jan. 9, 2012 in Korean Patent Application No. 10-2010-0018809 (with English translation).
Japanese Office Action Issued Dec. 4, 2012 in Patent Application No. 2009-115502 (with English translation).
Office Action issued Sep. 9, 2013 in German Patent Application No. 10 2010 011 112.0 with English language translation.

* cited by examiner

*Primary Examiner* — Cuong Q Nguyen
(74) *Attorney, Agent, or Firm* — Oblon, Spivak, McClelland, Maier & Neustadt, L.L.P.

(57) ABSTRACT

A semiconductor device using one or more guard rings includes a p-type guard ring region surrounding a pn junction region, an insulating film covering the p-type guard ring region, one or more conductive films electrically connected with the p-type guard ring region through one or more contact holes made in the insulating film, and a semi-insulating film covering the insulating film and the conductive films. Thus, a desired breakdown voltage characteristic can be ensured even if a foreign matter or the like adheres to a surface of the conductive films.

19 Claims, 11 Drawing Sheets

US 8,809,969 B2

SEMICONDUCTOR DEVICE

BACKGROUND OF THE INVENTION

1. Field of the Invention

The present invention relates to a semiconductor device, and particularly to a semiconductor device including one or more guard rings for ensuring a desired breakdown voltage characteristic.

2. Description of the Background Art

Generally, a semiconductor device keeping a predetermined voltage by a pn junction or Schottky junction includes one or more guard rings for ensuring a desired breakdown voltage characteristic. Referring to FIGS. 20 and 21, a common semiconductor device that keeps a predetermined voltage by a pn junction and includes a plurality of guard rings will be described.

This semiconductor device includes an n-type semiconductor substrate 101 and a p-type semiconductor region 102 extending inward to a predetermined depth from one main surface of n-type semiconductor substrate 101. Between n-type semiconductor substrate 101 and p-type semiconductor region 102, an annular pn junction region (main junction region) 108 is formed. An anode electrode 113 is disposed in contact with a surface of p-type semiconductor region 102. On another main surface of n-type semiconductor substrate 101, a cathode electrode 114 is disposed in contact with n-type semiconductor substrate 101.

In a peripheral region in the semiconductor device, a plurality of p-type guard rings 103, 104, 105, 106 (hereinafter these guard rings will also be collectively referred to as p-type guard ring region 107) are arranged annularly. P-type guard ring region 107 is arranged such that the constituent guard rings are spaced at predetermined intervals and surround pn junction region 108.

The one main surface of n-type semiconductor substrate 101 is covered with an insulating film 109. A conductive film 111 is electrically connected with p-type guard ring region 107 via a contact hole 110 running through insulating film 109.

When a voltage is applied to such a semiconductor device, p-type guard ring region 107 serves to allow a surface potential of insulating film 109 near p-type guard ring region 107 to be identical to a potential of p-type guard ring region 107. In other words, a depletion layer uniformly extends rightward (FIG. 21), so that a potential difference between an upper portion and a lower portion of insulating film 109 (FIG. 21) can be decreased. Accordingly, an electric field of the pn junction is alleviated and a desired breakdown voltage characteristic of the semiconductor device can be ensured.

Here, if the voltage applied to the semiconductor device is smaller, the extent of the depletion layer is also smaller. In this case, the number of guard rings required for ensuring a desired breakdown voltage may also be smaller. If, however, a higher voltage of 600 V or more is applied, the depletion layer has to be extended further in order to ensure a desired breakdown voltage characteristic. Accordingly, the number of guard rings constituting the guard ring region has to be increased. The increased number of guard rings results in a larger area of the semiconductor device. If, for example, a breakdown voltage characteristic of 1200 V of the semiconductor device using silicon is to be ensured, five or more guard rings are necessary and the width of the guard ring region itself is 200 μm or more.

A technique has been proposed for the purpose of reducing the surface area of the semiconductor device by, for example, making smaller the distance between guard rings constituting the guard ring region. If the distance between the guard rings is decreased, the distance between conductive films electrically connected with respective guard rings is also decreased. Japanese Patent Laying-Open No. 2003-078138 discloses a relevant technique for reducing the surface area of a semiconductor device.

SUMMARY OF THE INVENTION

Reduction of the surface area of a semiconductor device is accompanied by reduction of the distance between conductive films electrically connected with respective guard rings, as described above. Referring to FIG. 22 for example, if a foreign matter 200 or the like adheres to a surface of the semiconductor device, conductive films 111A and 111B adjacent to each other are short-circuited and accordingly respective p-type guard rings electrically connected with these conductive films and adjacent to each other are also short-circuited.

Consequently, a depletion layer non-uniformly extends from pn junction region 108 when a voltage is applied, and an electric field of pn junction region 108 or p-type guard ring region 107 becomes stronger. In this case, therefore, a desired breakdown voltage characteristic of the semiconductor device cannot be ensured.

The factor of the failure in ensuring a desired breakdown voltage characteristic of the semiconductor device is not limited to foreign matter 200 adhering to a surface of the semiconductor device. As the distance between conductive films electrically connected with respective guard rings is decreased, a scratch made in a surface of p-type guard ring region 107, and a pattern defect that is likely to occur due to the decreased interval between p-type guard rings of p-type guard ring region 107, in addition to foreign matter 200, also cause deterioration of the breakdown voltage characteristic of the semiconductor device.

As for a guard ring disclosed in Japanese Patent Laying-Open No. 2003-078138, the guard ring itself is divided into sections arranged in zigzag manner so as to reduce the area of the semiconductor device. In the semiconductor device having this structure, however, a depletion layer extends non-uniformly and thus the field strength is also non-uniform. Therefore, a desired breakdown voltage characteristic cannot be ensured.

The present invention has been made to solve the above-described problems, and an object of the invention is to provide a semiconductor device with a desired breakdown voltage characteristic ensured even if a foreign matter or the like adheres to a surface of a conductive film.

According to the present invention, a semiconductor device includes: a semiconductor substrate of a first conductivity type; an impurity diffusion region of a second conductivity type disposed to extend to a predetermined depth from a first main surface of the semiconductor substrate toward a second main surface of the semiconductor substrate, an annular junction region being formed between the impurity diffusion region and the semiconductor substrate; a plurality of annular guard rings of the second conductivity type disposed at the first main surface of the semiconductor substrate to surround the junction region and to be spaced from each other by a predetermined distance in a normal direction; a first interlayer insulating film disposed to cover the first main surface of the semiconductor substrate; one or more conductive films disposed to extend in one or more contact holes running in a thickness direction through the first interlayer insulating film, the one or more conductive films being electrically connected with the guard rings of the second conductivity type; and a second interlayer insulating film disposed to cover the first interlayer insulating film and the one or more conductive films. The second interlayer insulating film is of a semi-insulating material. The one or more conductive films include a discontinuous region located between the plurality of guard rings and the second interlayer insulating film, and disposed along the annular guard rings. The discontinuous region includes one or more discrete portions where the one or more conductive films are present and one or more interruptions where the one or more conductive films are absent.

Preferably, the semiconductor substrate is of n-type, the impurity diffusion region is of p-type, the junction region forms a pn junction, and the semiconductor device holds an applied voltage by the pn junction.

Preferably, one of silicon and silicon carbide is used for the semiconductor substrate.

Preferably, a field effect transistor having a gate electrode is formed at the first main surface of the semiconductor substrate, and poly-Si is used for the gate electrode and the one or more conductive films electrically connected with the guard rings.

Preferably, a field effect transistor having a gate electrode is formed at the first main surface of the semiconductor substrate, and Mo is used for the gate electrode and the one or more conductive films electrically connected with the guard rings.

Preferably, the semiconductor substrate is of n-type, the impurity diffusion region is of p-type, the semiconductor device holds an applied voltage by a Schottky junction disposed at the semiconductor substrate, and the junction region is disposed to surround the Schottky junction.

Preferably, silicon carbide is used for the semiconductor substrate, and the first interlayer insulating film is of silicon dioxide, and the second interlayer insulating film is of semi-insulating silicon nitride.

Preferably, the silicon nitride has an electrical conductivity $[(1/\Omega) cm]$ of not more than $1 \times 10^{-13}$ at room temperature and not less than $1 \times 10^{-12}$ at 110° C.

Preferably, a maximum circumferential dimension of a projected shape formed by projecting, in the normal direction, one discrete portion of the one or more discrete portions of a first conductive film of the conductive films including the discontinuous region, on a second conductive film of the conductive films that is adjacent to the first conductive film in the normal direction and includes the discontinuous region, is included in a minimum circumferential dimension of one interruption of the one or more interruptions of the second conductive film.

Preferably, a minimum circumferential dimension of one interruption of the one or more interruptions of one of the conductive films including the discontinuous region is larger than a maximum distance in the normal direction between conductive films opposite to each other in the normal direction with respect to the one interruption.

Preferably, the conductive films including the discontinuous region disposed along the guard rings are all disposed discontinuously along the guard rings.

Preferably, the conductive films including the discontinuous region disposed along the guard rings include: a conductive film located between an outermost one of the guard rings and the second interlayer insulating film and disposed continuously along the outermost guard ring; and a conductive film located inside the outermost guard ring and disposed discontinuously along the guard rings.

Preferably, a width in the normal direction of one of the conductive films is smaller than a width in the normal direction of one of the guard rings that is electrically connected with the one of the conductive films.

Preferably, the one or more conductive films are disposed to extend only in the one or more contact holes running in the thickness direction through the first interlayer insulating film.

Preferably, the one or more conductive films include a W plug in the one or more contact holes, and are electrically connected with the guard rings through the W plug.

In accordance with the present invention, in a semiconductor device using one or more guard ring, a desired breakdown voltage characteristic is ensured even if a foreign matter or the like adheres to a surface of a conductive film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
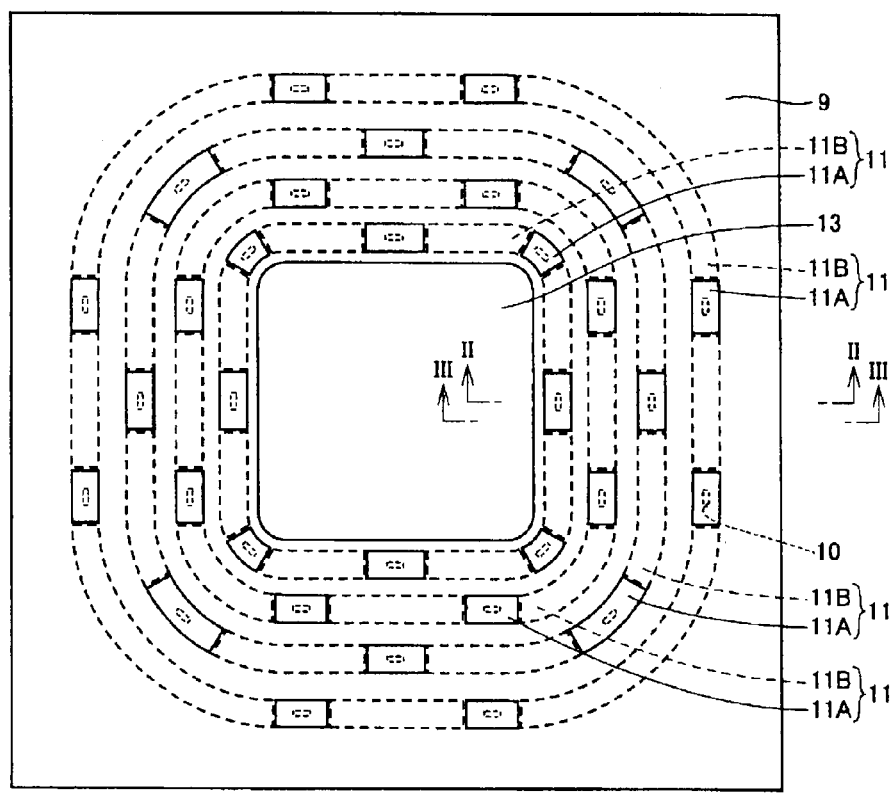
FIG. 1 is a plan view showing the whole structure of a semiconductor device according to a first embodiment.

A semiconductor device in each embodiment based on the present invention will be hereinafter described with reference to the drawings. In the following description of each embodiment, where the number, amount, or the like is referred to, the scope of the present invention is not necessarily limited to the number, amount or the like unless otherwise specified. Further, like or corresponding components are denoted by like reference characters, and a description thereof will not be repeated as the case may be.

First Embodiment

Figure 2:
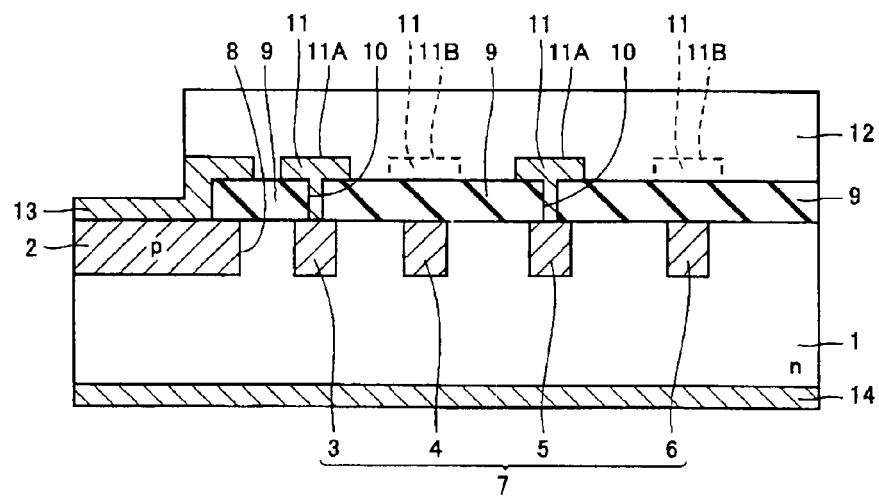
FIG. 2 is a cross section along an arrow-headed line II-II in FIG. 1.
Figure 3:
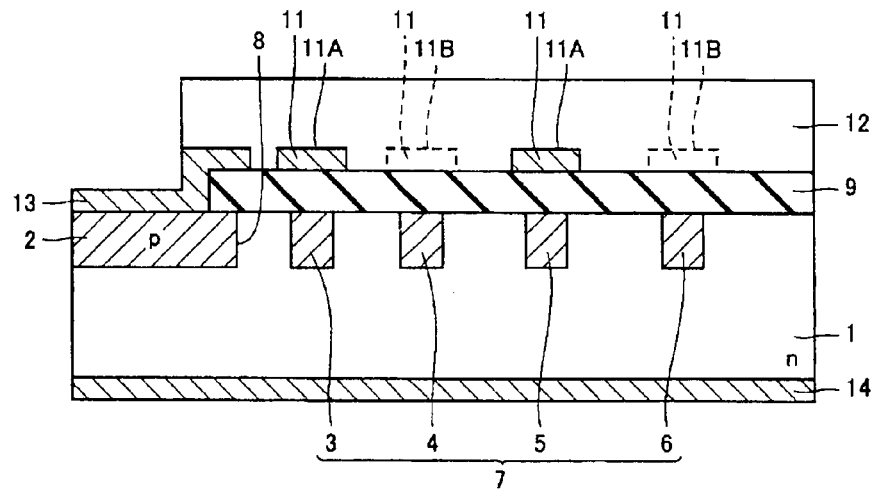
FIG. 3 is a cross section along an arrow-headed line III-III in FIG. 1.

Referring to FIGS. 1 to 3, a structure of a semiconductor device in a first embodiment will be described. The semiconductor device in the first embodiment includes a semiconductor substrate 1 of n-type, which is a first conductivity type, having a pair of a first main surface and a second main surface. In a central region of the first main surface of n-type semiconductor substrate 1, there is provided a semiconductor region 2 of p-type, which is a second conductivity type, extending to a predetermined depth from the first main surface of n-type semiconductor substrate 1 toward the second main surface of n-type semiconductor substrate 1.

Between n-type semiconductor substrate 1 and p-type semiconductor region 2, an annular pn junction region 8 (main junction region) is formed. On a surface of p-type semiconductor region 2, an anode electrode 13 is disposed in contact with p-type semiconductor region 2. On the second main surface of n-type semiconductor substrate 1, a cathode electrode 14 is disposed in contact with n-type semiconductor substrate 1.

In a peripheral region in the first main surface of n-type semiconductor substrate 1, a plurality of p-type guard rings 3, 4, 5, 6 (hereinafter these guard rings will be collectively referred to as p-type guard ring region 7 as the case may be) are annularly disposed. P-type guard ring region 7 extends to a predetermined depth from the first main surface of n-type semiconductor substrate 1 toward the second main surface thereof. P-type guard ring region 7 is disposed to surround pn junction region 8, and the guard rings of p-type guard ring region 7 are spaced by a predetermined distance in the normal direction ("normal direction" herein refers to the direction perpendicular to a tangent to annular p-type guard ring region 7 at a point of p-type guard ring region 7).

The first main surface of n-type semiconductor substrate 1 is covered with an insulating film 9. In a part of the region where p-type guard ring region 7 and insulating film 9 abut on each other, a plurality of contact holes 10 running through insulating film 9 in the thickness direction are provided. A conductive film 11 is disposed opposite to p-type guard ring region 7 with respect to insulating film 9.

Through the inside of contact hole 10, conductive film 11 is electrically connected with p-type guard ring region 7 located on the opposite side. Further, a high resistance conductive semi-insulating film 12 is disposed on respective surfaces of insulating film 9 and conductive film 11 so as to cover insulating film 9 and conductive film 11.

Conductive film 11 located between p-type guard ring region 7 and semi-insulating film 12 is disposed discontinuously. Specifically, while p-type guard ring region 7 is disposed annularly without interruptions or breaks, conductive film 11 is disposed discontinuously along annular p-type guard ring region 7 with which conductive film 11 is electrically connected. Conductive film 11 disposed discontinuously thus includes a discrete portion 11A where conductive film 11 is present and an interruption 11B where conductive film 11 is absent.

Functions and Effects

Functions and effects achieved when a voltage is applied to the semiconductor device with the above-described structure will be described. When a forward bias is applied to the semiconductor device with a polarity that anode electrode 13 is positive and cathode electrode 14 is negative, pn junction region 8 is forward-biased. Then, holes are injected as minority carriers from p-type semiconductor region 2 into n-type semiconductor substrate 1, while electrons are injected from cathode electrode 14 into n-type semiconductor substrate 1. Thus, holes and a large number of electrons are contained in n-type semiconductor substrate 1.

Next, a reverse bias is applied to the semiconductor device with a polarity that anode electrode 13 is negative and cathode electrode 14 is positive, and pn junction region 8 is reverse-biased. Since n-type semiconductor substrate 1 has a higher specific resistance and a lower impurity concentration than p-type semiconductor region 2, a depletion layer extends from pn junction region 8 chiefly into n-type semiconductor substrate 1.

Thus, a desired breakdown voltage characteristic of the semiconductor device can be ensured. More specifically, p-type guard ring region 7 is disposed annularly without interruptions to surround pn junction region 8. Conductive film 11 electrically connected with p-type guard ring region 7 is disposed discontinuously and semi-insulating film 12 is disposed to cover conductive film 11 and insulating film 9. Therefore, when a voltage is applied, the electric field at respective surfaces of discrete portions 11A, 11A of conductive film 11 that are circumferentially spaced from each other evenly spreads, and the depletion layer extends uniformly in n-type semiconductor substrate 1. A desired breakdown voltage characteristic of the semiconductor device can thus be ensured.

If the guard ring region itself is divided into discrete sections with interruptions therebetween and the semi-insulating film covering the conductive film is absent, extension of the depletion layer is unstable and thus non-uniform. More specifically, on the surface of the conductive film, holes gather on a part of the surface located on the pn junction region side, while electrons gather on a part of the surface located opposite to the pn junction region side. Accordingly, the surface of the conductive film is polarized.

Because of the polarization of the surface of the conductive film, the depletion layer is more likely to extend from the pn junction region chiefly to an interruption of the guard ring region, and the extension of the depletion layer is distorted in the vicinity of the interruption. Consequently, the field strength of a peripheral region in the semiconductor device increases, and the breakdown voltage characteristic is deteriorated. The same consequence as described above will result in the case where the guard ring region itself is divided into discrete sections and the conductive film is covered with an insulating film instead of the semi-insulating film.

In contrast, in the structure of the first embodiment, since polarization of holes and electrons does not occur, and thus the depletion layer extends uniformly and a desired breakdown voltage characteristic of the semiconductor device can be ensured.

In another case where the guard ring region is disposed annularly without interruptions and the conductive film electrically connected with the guard ring region is also disposed annularly and continuously without interruptions, a similar breakdown voltage characteristic to the first embodiment can be ensured without the semi-insulating film. In this case, however, influences of a foreign matter adhering to a surface of the semiconductor device and a pattern defect due to a reduced surface area of the semiconductor device, for example, cause short circuit between conductive films as described above, and a desired breakdown voltage characteristic of the semiconductor device cannot be ensured.

In contrast, in the structure of the first embodiment, conductive films 11 adjacent to each other in the normal direction are spaced by a predetermined distance, and discrete portions 11A of each conductive film 11 are circumferentially spaced from each other with interruption 11B therebetween. In other words, even if the surface area of the semiconductor device is reduced, short circuit between the conductive films due to a foreign matter or pattern defect can be prevented, since a predetermined distance in the normal direction between discrete portions 11A, 11A and a predetermined distance in the circumferential direction between discrete portions 11A, 11A are both maintained. A desired breakdown voltage characteristic can be accordingly ensured.

An experiment was performed as follows. A semiconductor device was structured as a sample by disposing a guard ring region annularly without interruptions, disposing a conductive film electrically connected with the guard ring region such that the conductive film extends annularly and continuously without interruptions, and disposing a semi-insulating film. Another semiconductor device of a similar size and similar materials to the above-described semiconductor device was also structured as a sample according to the first embodiment. Respective breakdown voltage characteristics of these semiconductor devices were compared with each other. As a result, the former semiconductor device had a breakdown voltage characteristic of 1350 V to 1400 V while the latter semiconductor device, namely the semiconductor device of the first embodiment had a breakdown voltage characteristic of 1350 V to 1400 V. It is seen from above that a desired breakdown voltage characteristic of the semiconductor device can be ensured according to the first embodiment.

Another experiment was performed as follows. The former semiconductor device was structured as described above, namely a semiconductor device was structured by disposing a guard ring region annularly without interruptions, disposing a conductive film electrically connected with the guard ring region such that the conductive film extends annularly and continuously without interruptions, and disposing a semi-insulating film. Conductive films adjacent to each other of this semiconductor device were short-circuited intentionally. At this time, the former semiconductor device had a breakdown voltage characteristic of 1200 V to 1300 V. It is established from above that, if conductive films adjacent to each other are short-circuited due to a foreign matter or the like attaching to the semiconductor device, the breakdown voltage characteristic is deteriorated. It is therefore understood that prevention of the short circuit between conductive films in the semiconductor device of the present embodiment provides an effect that the semiconductor device can have a desired breakdown voltage characteristic.

Modifications of the Structure of First Embodiment

Figure 4:
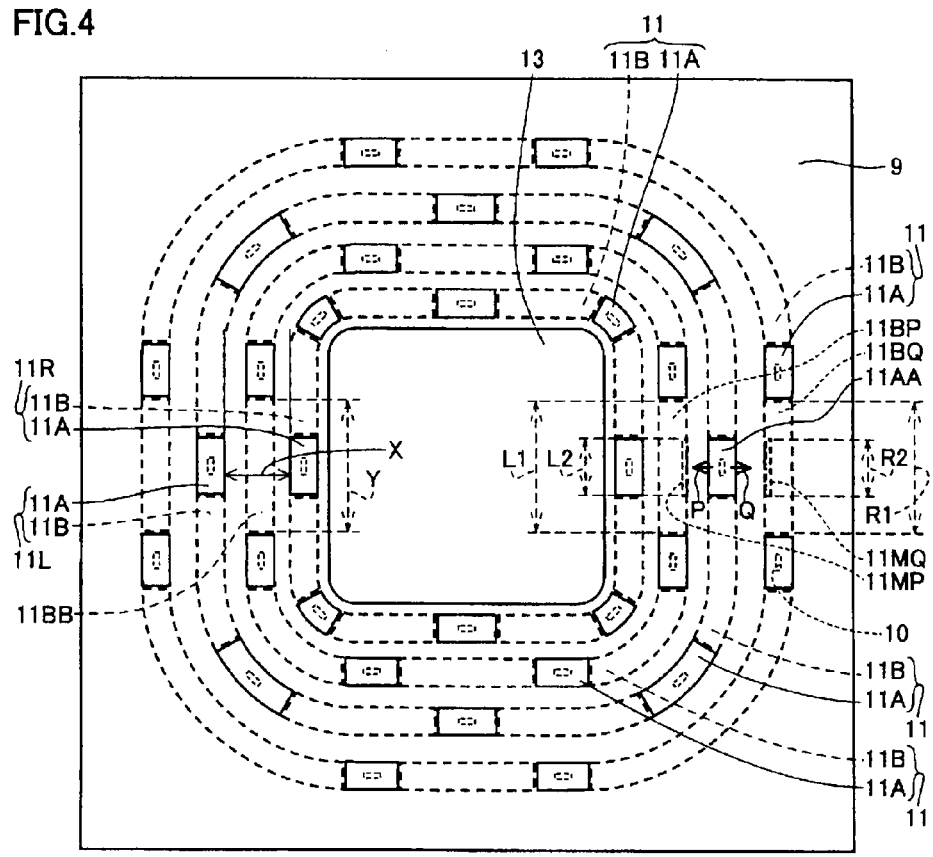
FIG. 4 is a plan view showing the whole structure of a semiconductor device with another conductive film layout according to the first embodiment.

Referring to FIG. 4 (particularly the right side), discrete portions 11A of conductive films 11 are preferably arranged in so-called zigzag manner. More specifically, a maximum distance L2 may be included in a minimum distance L1. Here, maximum distance L2 refers to the circumferential maximum dimension of a projected shape 11MP formed by normally (in the direction indicated by arrow P) projecting a discrete portion 11AA of a first conductive film 11 on a second conductive film 11 that is located adjacent to first conductive film 11 in the normal direction (direction indicated by arrow P) and includes a discontinuous region. Minimum distance L1 refers to the circumferential minimum dimension of an interruption 11BP of this second conductive film 11.

Likewise, a maximum distance R2 may be included in a minimum distance R1. Here, maximum distance R2 refers to the maximum circumferential dimension of a projected shape 11MQ formed by normally (in the direction indicated by arrow Q) projecting discrete portion 11AA of first conductive film 11 including a discontinuous region on a third conductive film 11 located adjacent to first conductive film 11 in the normal direction (direction indicated by arrow Q) and including a discontinuous region. Minimum distance R1 refers to the minimum circumferential dimension of an interruption 11BQ of this third conductive film 11.

Accordingly, even if the surface area of the semiconductor device having the above-described structure is reduced, an appropriate distance between discrete portions 11A, 11A of conductive films 11, 11 is maintained since discrete portions 11A, 11A of conductive films 11, 11 are arranged in so-called zigzag manner.

In other words, a sufficient distance is kept between a discrete portion 11A of conductive film 11 disposed discontinuously along a first p-type guard ring and a discrete portion 11A of another conductive film 11 disposed discontinuously along a second p-type guard ring located adjacent to the first p-type guard ring. A sufficient distance is also kept between discrete portion 11A of conductive film 11 disposed discontinuously along the first p-type guard ring and a discrete portion 11A of still another conductive film 11 disposed discontinuously along a third p-type guard ring that is located on the opposite side to the first p-type guard ring with respect to the second p-type guard ring adjacent to the first p-type guard ring.

In this way, short circuit between conductive films 11, 11 due to influences of a foreign matter adhering to a surface of the semiconductor device and a pattern defect that could occur due to reduction in surface area of the semiconductor device, for example, can be prevented, and a desired breakdown voltage characteristic of the semiconductor device can be ensured.

While the description given above with reference to FIG. 4 is based on exemplary discrete portion 11AA that is substantially linear, a similar description is applied to other arc-shaped discrete portions 11A. In this case, maximum distance L2 (or R2) in the circumferential direction of the above-described projected shape refers to the longer one of the circumferential dimensions of the projected shape formed by projecting arc-shaped discrete portion 11A (the longer circumferential dimension is the outer circumferential dimension in FIG. 4). Regarding an arc-shaped interruption, minimum distance L1 (or R1) refers to the shorter one of the circumferential dimensions of the arc-shaped interruption (the shorter circumferential dimension is the inner circumferential dimension in FIG. 4). Thus, maximum circumferential distance L2 (or R2) of the projected shape formed in the above-described manner is preferably included in the minimum circumferential distance L1 (or R1) of the arc-shaped interruption.

Referring again to FIG. 4 (particularly the left side), a minimum distance Y is preferably larger than a maximum distance X. Here, minimum distance Y refers to the minimum circumferential dimension of an interruption 11BB that is one of interruptions 11B of conductive films 11, 11 including a discontinuous region. Maximum distance X refers to the distance in the normal direction between conductive films 11L, 11R located opposite to each other in the normal direction with respect to this interruption 11BB.

In the above-described structure, an appropriate distance between discrete portions 11A, 11A of conductive films 11, 11 is maintained. Therefore, short circuit can be prevented between conductive films 11, 11 due to influences of a foreign matter adhering to a surface of the semiconductor device and a pattern defect that is likely to occur due to reduction in surface area of the semiconductor device, for example, and a desired breakdown voltage characteristic of the semiconductor device can be ensured.

As for respective discrete portions 11A, 11A of conductive films 11, 11 spaced from each other in the normal direction, an increased distance between these discrete portions 11A, 11A influences expansion of the depletion layer, because respective potentials of the discrete portions are different from each other when a voltage is applied to the semiconductor device. As for discrete portions 11A, 11A of the same conductive film 11 that are circumferentially spaced from each other with interruption 11BB therebetween, an increased distance between these discrete portions 11A, 11A does not influence expansion of the depletion layer, because respective potentials of the discrete portions are identical to each other when a voltage is applied to the semiconductor device.

Therefore, it is preferable that the minimum distance between discrete portions 11A, 11A of the same conductive film 11 that are adjacent to each other, namely the circumferential minimum dimension Y of interruption 11 BB, is preferably larger than maximum distance X in the normal direction between conductive films 11L, 11R adjacent to each other with this interruption 11 BB therebetween.

While the description given above with reference to FIG. 4 is based on substantially linear interruption 11 BB as an example, a similar description is applied to other arc-shaped interruptions 11B. In this case, minimum distance Y as described above refers to the longer one of the circumferential dimensions of arc-shaped interruption 11B. In the case where conductive films 11L, 11R located opposite to each other in the normal direction with interruption 11B therebetween are arc-shaped and the distance in the normal direction between these conductive films is not constant, the maximum distance in the normal direction between the conductive films corresponds to above-described maximum distance X. Therefore, minimum distance Y in the circumferential direction of the interruption thus determined is preferably larger than maximum distance X between conductive films 11 opposite to each other as determined similarly.

According to the above description of the structure with reference to FIGS. 1 to 4, conductive film 11 is disposed discontinuously along p-type guard ring region 7. All conductive films 11 may be disposed discontinuously along p-type guard ring region 7. In this structure, the depletion layer extends uniformly as described above. Further, since an appropriate distance between discrete portions 11A, 11A of conductive films 11, 11 is maintained, short circuit between the conductive films due to a foreign matter or pattern defect can be prevented and a desired breakdown voltage characteristic of the semiconductor device can be ensured.

Figure 5:
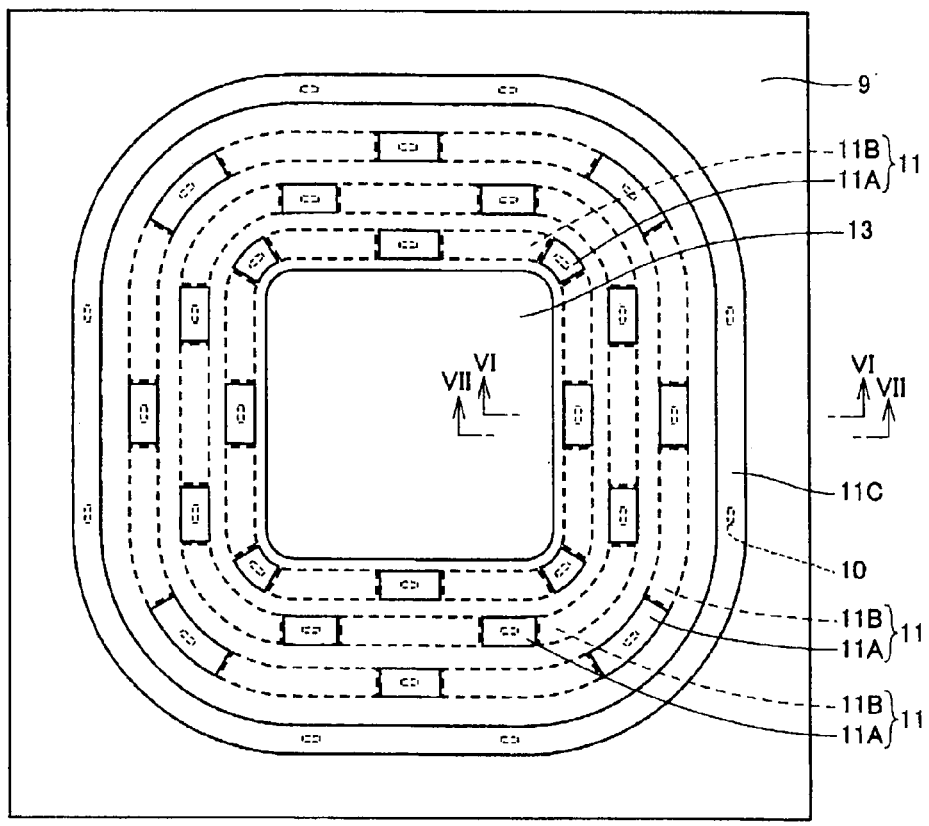
FIG. 5 is a plan view showing the whole structure of a semiconductor device where an outermost conductive film is continuously disposed.
Figure 6:
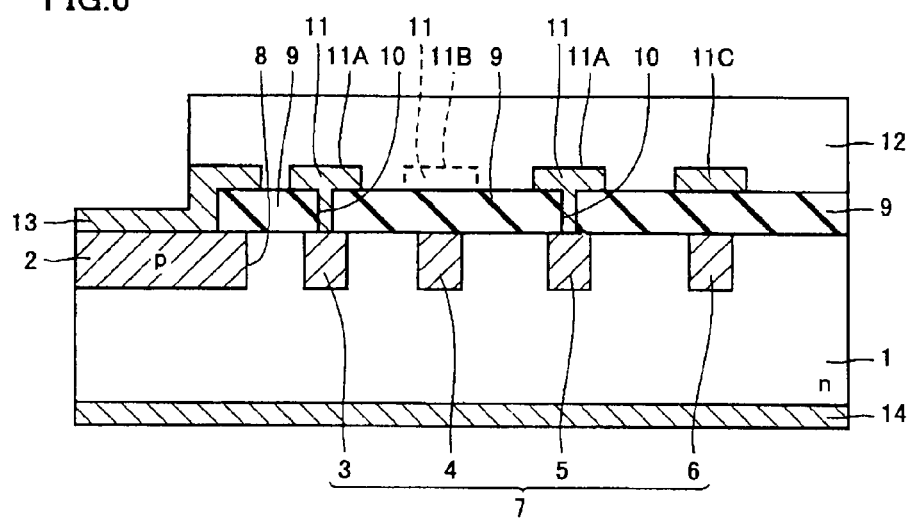
FIG. 6 is a cross section along an arrow-headed line VI-VI in FIG. 5.
Figure 7:
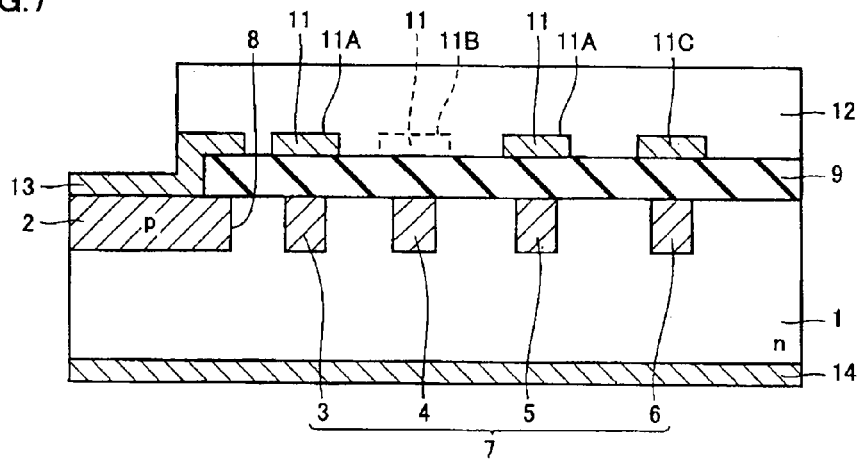
FIG. 7 is a cross section along an arrow-headed line VII-VII in FIG. 5.

Referring to FIGS. 5, 6 and 7, respective conductive films 11 along p-type guard rings 3, 4, 5 located on the inner side relative to outermost p-type guard ring 6 in p-type guard ring region 7 is preferably disposed discontinuously as described above.

The conductive film disposed along outermost p-type guard ring 6, namely conductive film 11C, is preferably disposed continuously along this outermost p-type guard ring 6. Since other features are similar to those of the first embodiment as described above, like components are denoted by like reference characters and the description thereof will not be repeated.

In the structure as described above, extension of the depletion layer from pn junction region 8 can be made more uniform. Generally, the distance between outermost p-type guard ring 6 and the inner most adjacent p-type guard ring 5 is largest among other distances between guard rings in p-type guard ring region 7. It is therefore extremely unlikely that short circuit occurs between p-type guard ring 5 and p-type guard ring 6 or between the conductive films electrically connected with p-type guard ring 5 and p-type guard ring 6.

Thus, all conductive films 11, 11 except for conductive film 11C electrically connected with the outermost p-type guard ring are disposed discontinuously. Accordingly, an appropriate distance between discrete portions 11A, 11A of conductive films 11, 11 is maintained, so that short circuit between conductive films 11 due to a foreign matter or pattern defect can be prevented and a desired breakdown voltage characteristic of the semiconductor device can be further ensured.

Figure 8:
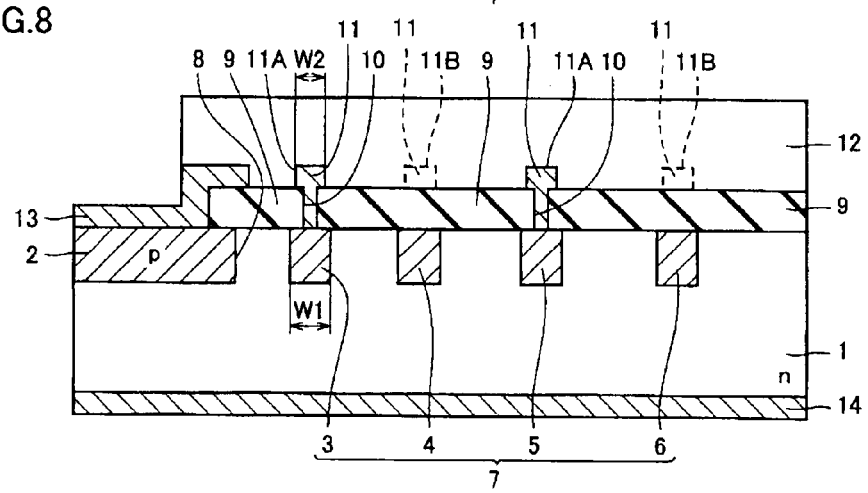
FIG. 8 is a cross section showing another conductive film structure used for a semiconductor device according to the first embodiment.
Figure 9:
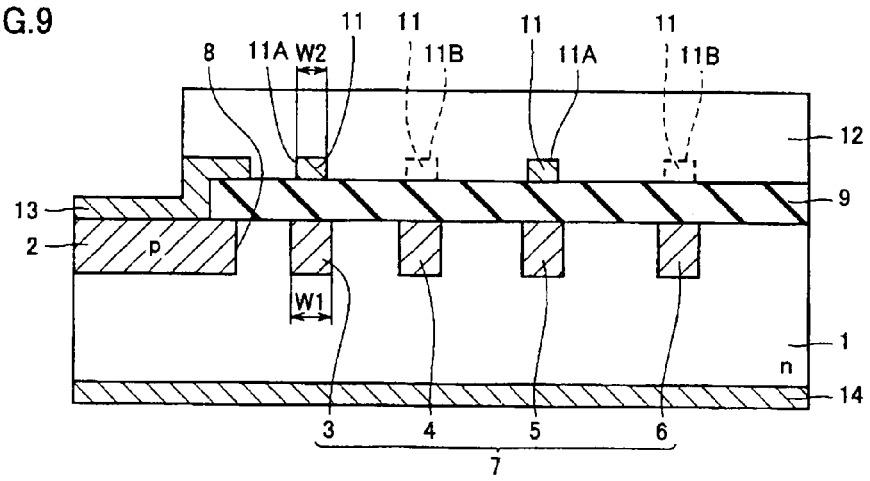
FIG. 9 is a cross section showing still another conductive film structure used for a semiconductor device according to the first embodiment.

Referring to FIGS. 8 and 9, a width W2 in the normal direction of conductive film 11 that is disposed discontinuously along p-type guard ring region 7 is preferably smaller than a width W1 in the normal direction of the p-type guard ring connected electrically with conductive film 11. It should be noted that a plan view of the semiconductor device shown in FIGS. 8 and 9 is almost similar to the plan view of FIG. 1. Namely, FIG. 8 corresponds to FIG. 2 showing the same device as FIG. 1, and FIG. 9 corresponds to FIG. 3 showing the same device as FIG. 1.

Referring again to FIGS. 8 and 9, the semiconductor device with the structure as shown includes a semi-insulating film 12 covering conductive films 11. Therefore, the depletion layer can be extended uniformly as described above, without using the field plate effect. Here, the field plate effect generally refers to one of the effects provided by a technique for improving the breakdown voltage characteristic. Specifically, an electric field at an edge of the depletion layer extending from the pn junction, in the vicinity of the surface of the semiconductor device, can be alleviated by allowing the depletion layer to expand from the surface of the semiconductor device, so that the breakdown voltage characteristic is improved.

Therefore, even if width W2 in the normal direction of conductive film 11 is made smaller than width W1 in the normal direction of the p-type guard ring connected electrically with conductive film 11 as described above, the depletion layer can be extended uniformly. Further, larger distances between discrete portions 11A, 11A of conductive films 11, 11 can be maintained in the normal direction and the circumferential direction of conductive films 11, 11. Accordingly, short circuit between conductive films 11 due to a foreign matter or pattern defect can be prevented more effectively, and a desired breakdown voltage characteristic of the semiconductor device can be ensured.

Figure 10:
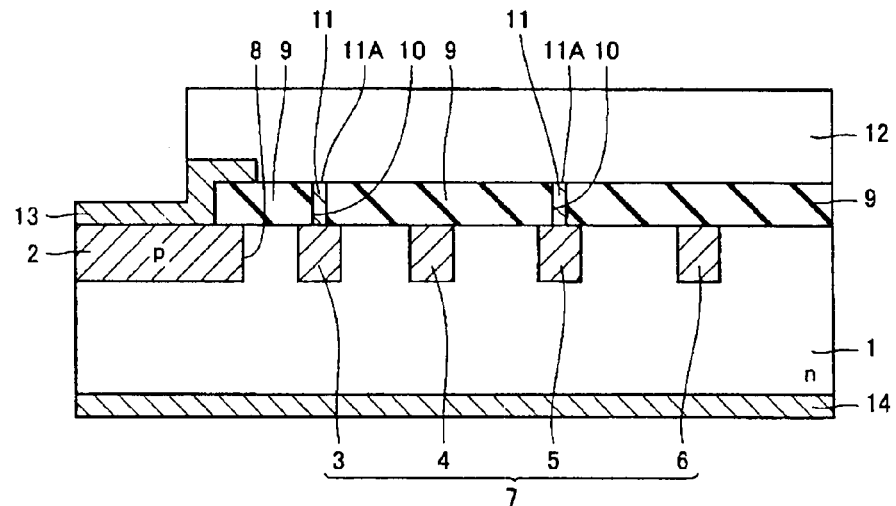
FIG. 10 is a cross section showing a further conductive film structure used for a semiconductor device according to the first embodiment.
Figure 11:
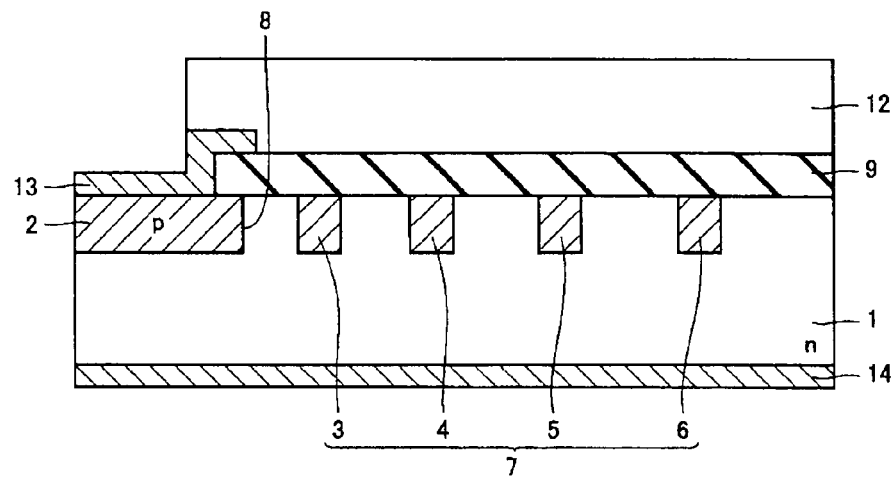
FIG. 11 is a cross section showing a further conductive film structure used for a semiconductor device according to the first embodiment.

Referring to 10 and 11, conductive film 11 disposed discontinuously along p-type guard ring region 7 is preferably disposed only in the inside of contact hole 10 extending in the thickness direction through insulating film 9. Namely, conductive film 11 is preferably embedded in contact hole 10. It should be noted that a plan view of the semiconductor device shown in FIGS. 10 and 11 is almost similar to the plan view of FIG. 1. Namely, FIG. 10 corresponds to FIG. 2 showing the same device as FIG. 1, and FIG. 11 corresponds to FIG. 3 showing the same device as FIG. 1.

Referring again to FIGS. 10 and 11, the semiconductor device structured in the above-described manner includes a semi-insulating film 12 that covers conductive film 11. Thus, the depletion layer can be extended uniformly as described above without using the field plate effect.

Accordingly, in this structure, uniform extension of the depletion layer can be achieved. Even if the surface area of the semiconductor device is reduced, a larger distance in the normal direction between discrete portions 11A, 11A of conductive films 11, 11, and a larger distance in the circumferential direction between discrete portions 11A, 11A of conductive film 11 can be ensured. Thus, short circuit between conductive films 11 due to a foreign matter or pattern defect can be more effectively prevented, and a desired breakdown voltage characteristic of the semiconductor device can be ensured.

Referring to FIGS. 10 and 11 again, in the structure where conductive film 11 is embedded in contact hole 10, a feature may be applied that a W plug (tungsten plug) or poly-Si is embedded in contact hole 10. Such a structure can be achieved by embedding a W plug or poly-Si in contact hole 10 through an embedding CVD (Chemical Vapor Deposition) procedure.

This structure can provide functions and effects similar to those provided by the structure in which conductive film 11 is embedded in contact hole 10. Specifically, even if the surface area of the semiconductor device is reduced, a larger distance between discrete portions 11A, 11A of conductive films 11, 11 that are spaced from each other in the normal direction as well as a larger distance between discrete portions 11A, 11A spaced from each other in the circumferential direction can be provided. Accordingly, short circuit between conductive films 11 due to a foreign matter or pattern defect can be more effectively prevented, and a desired breakdown voltage characteristic of the semiconductor device can be ensured.

The structure in which a W plug or poly-Si is embedded in contact hole 10 is not limited to the structure as shown in FIGS. 10 and 11, and may be applied to a structure (as shown for example in FIGS. 2 and 3 or FIGS. 6 to 9) in which conductive film 11 is disposed to protrude from the surface of insulating film 9. Specifically, the W plug or poly-Si may be embedded in contact hole 10 and conductive film 11 may be disposed on the surface of this contact hole 10. This structure can accordingly provide functions and effects similar to those as described above.

While the first conductivity type is n-type and the second conductivity type is p-type according to the description above of the first embodiment, similar functions and effects to the above-described ones can be achieved even if the first conductivity type is p-type and the second conductivity type is n-type. Further, p-type semiconductor region 2 and p-type guard ring region 7 may not p-type of the same impurity concentration, and may be p-type of different concentrations respectively. Furthermore, p-type semiconductor region 2 and p-type guard ring region 7 may not extend to the same depth and may extend to different depths respectively. Under any of these conditions of the structure, similar functions and effects to the above-described ones can be achieved.

While the semiconductor device of the above-described first embodiment has the n-type semiconductor substrate of a single layer structure, the substrate may not necessarily be a single layer. The substrate may have a double layer structure including an $n^+$-type semiconductor region of a relatively high impurity concentration and an $n^-$-type semiconductor region of a relatively low impurity concentration that are arranged in this order on cathode electrode 14. Alternatively, the n-type semiconductor substrate may have a multilayer structure constituted of three or more layers.

For n-type semiconductor substrate 1, p-type semiconductor region 2 and p-type guard ring region 7, silicon Si or silicon carbide SiC is preferably used. In particular, when silicon carbide SiC is used for n-type semiconductor substrate 1, the particular effects as described below can be achieved in addition to the effects of the first embodiment. Specifically, in the case where silicon carbide SiC is used for n-type semiconductor substrate 1, an extension of the depletion layer necessary for ensuring a certain breakdown voltage characteristic is smaller than an extension thereof for ensuring the same breakdown voltage characteristic in the semiconductor device using silicon Si for the n-type semiconductor substrate. Therefore, in a semiconductor device using silicon carbide SiC for the substrate, the distance in the normal direction between guard rings of p-type guard ring region 7 can be made smaller than that in a semiconductor device using silicon Si for the substrate.

As the distance in the normal direction between guard rings of p-type guard ring region 7 is made smaller, the distance between discrete portions 11A, 11A spaced from each other in the normal direction of respective conductive films 11, 11 electrically connected with the guard rings is accordingly smaller. However, conductive film 11 is disposed discontinuously, and thus an appropriate distance between discrete portions 11A, 11A separated in the normal direction of respective conductive films 11, 11 as well as an appropriate distance between discrete portions 11A, 11A separated in the circumferential direction are ensured. Influences of a foreign matter or pattern defect can therefore be avoided. Accordingly, in the case where silicon carbide SiC is used for n-type semiconductor substrate 1, in addition to the effect that a desired breakdown voltage characteristic of the semiconductor device can be ensured, a particular effect that the size of the semiconductor device can be further reduced can be achieved.

Regarding respective materials for the components of the semiconductor device in the first embodiment as described above, preferably insulating film 9 is of silicon dioxide $SiO_2$, conductive film 11 is of aluminum Al and semi-insulating film 12 is of semi-insulating (high resistance conductive) silicon nitride SiN.

Here, the film of semi-insulting silicon nitride SiN has an electrical conductivity of not more than $1 \times 10^{-13}$ [$1/\Omega \cdot cm$] at room temperature under the condition that the field strength is 40 V/cm, and an electrical conductivity of not less than $1 \times 10^{-12}$ [$1/\Omega cm$] at 110° C. under the condition that the field strength is 40 V/cm. In the case where silicon nitride SiN is used for semi-insulting film 12, the material for insulating film 9 is not limited to $SiO_2$ and may be any of various other materials for an insulating film used in a semiconductor process. Likewise, the material for conductive film 11 in this case is not limited to Al and conductive film 11 may be any of various other metal films or a poly-Si film of high impurity concentration.

First Embodiment Applied to MOSFET or the Like

While a pn diode has been described above with reference to FIGS. 1 to 11 as an example of the semiconductor device of the present invention, the semiconductor device may be MOSFET or the like as long as the semiconductor device keeps a predetermined voltage by a pn junction. Namely, the semiconductor device may be a semiconductor device where a field effect transistor (FET) having a gate electrode is formed at a main surface of a pn diode. Examples of the field effect transistor having a gate electrode include, in addition to MOSFET, IGBT (Insulated Gate Bipolar Transistor), GTO (Gate Turn-Off Thyristor), bipolar transistor, and thyristor for example.

Figure 12:
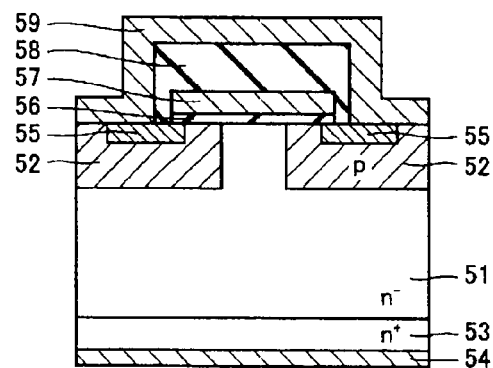
FIG. 12 is a cross section showing a MOSFET as a field effect transistor used for a semiconductor device according to the first embodiment.
Figure 13:
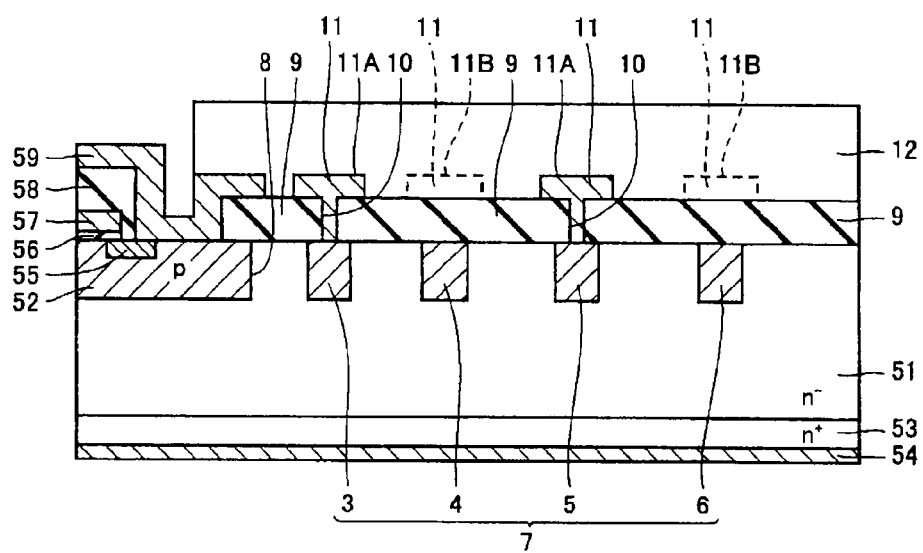
FIG. 13 is a cross section showing a structure of a peripheral region of a MOSFET provided as a field effect transistor used for a semiconductor device according to the first embodiment.
Figure 14:
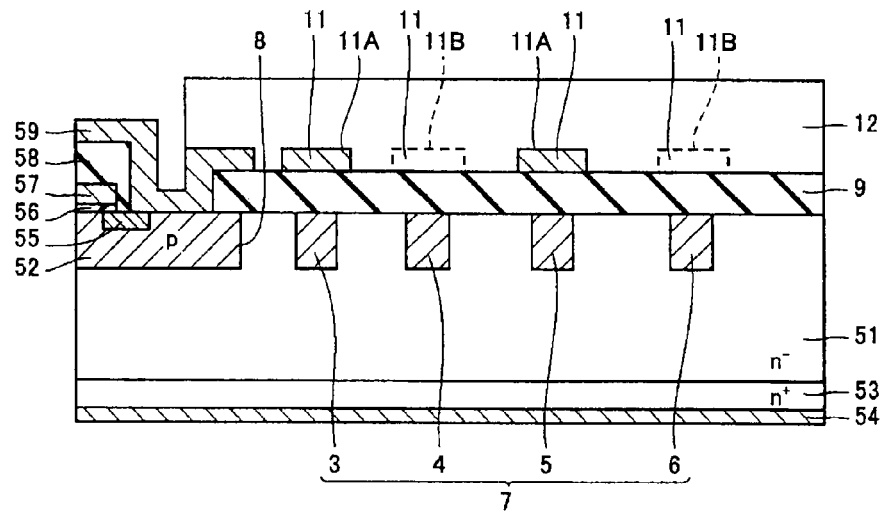
FIG. 14 is a cross section showing a structure of a peripheral region of a MOSFET provided as a field effect transistor used for a semiconductor device according to the first embodiment.

Referring to FIGS. 12 to 14, a description will be given of a semiconductor device where a MOSFET having a gate electrode is formed at a main surface of a pn diode. At a position corresponding to anode electrode 13 of the above-described semiconductor device, namely a position corresponding to a central region of the first main surface of n-type semiconductor substrate 1 in the first embodiment, a plurality of MOSFET unit structures are formed.

More specifically, the semiconductor device having a MOSFET with a gate electrode mainly includes a drain electrode 54, a source electrode 59, an n⁻-type semiconductor region 51, a p-type semiconductor region 52, an n⁺-type semiconductor region 53, an n-type source region 55, a gate oxide film 56, a gate electrode 57, and an insulating film 58.

P-type semiconductor region 52 is located at a part of a main surface of n⁻-type semiconductor region 51 to form an annular pn junction region 8 between n⁻-type semiconductor region 51 and p-type semiconductor region 52. N-type source region 55 is located at a part of a main surface in p-type semiconductor region 52 to form a pn junction between n-type source region 55 and p-type semiconductor region 52. On the main surface of the semiconductor device, source electrode 59 is disposed to be electrically connected with n-type source region 55. On a main surface of n⁺-type semiconductor region 53, drain electrode 54 is disposed to be electrically connected with n⁺-type semiconductor region 53.

Gate oxide film 56 is disposed between gate electrode 57 and n⁻-type semiconductor region 51 and at least located on a surface of p-type semiconductor region 52 between n-type source region 55 and n⁻-type semiconductor region 51. N⁻-type semiconductor region 51 and gate electrode 57 are electrically insulated from each other by gate oxide film 56. Gate electrode 57 is disposed on gate oxide film 56 and at least located opposite to the surface of p-type semiconductor region 52 between n-type source region 55 and n⁻-type semiconductor region 51.

Like the first embodiment (FIG. 1), a plurality of p-type guard rings 3, 4, 5, 6 (p-type guard ring region 7) are disposed annularly in a peripheral region in the main surface of the semiconductor substrate. On respective surfaces of insulating film 9 and conductive film 11, high resistance conductive semi-insulating film 12 is disposed to cover these films. Conductive film 11 located between a plurality of guard rings of p-type guard ring region 7 and semi-insulating film 12 is disposed discontinuously along annular p-type guard ring region 7. Details of these features and other features are similar to those of the first embodiment (FIG. 1). Like components are denoted by like reference characters, and the description thereof will not be repeated.

These features of the structure as described above can provide similar effects to the above-described first embodiment. Specifically, when a voltage is applied, an electric field at respective surfaces of discrete portions 11A, 11A of conductive film 11 that are circumferentially spaced from each other evenly spreads, and the depletion layer extends uniformly in n⁻-type semiconductor substrate 51. A desired breakdown voltage characteristic of the semiconductor device can thus be ensured. Further, even if the surface area of the semiconductor device is reduced, short circuit between conductive films due to a foreign matter or pattern defect can be prevented, since a predetermined distance in the normal direction between discrete portions 11A, 11A and a predetermined distance in the circumferential direction between discrete portions 11A, 11A are kept. Thus, a desired breakdown voltage characteristic of the semiconductor device can be ensured.

In the case of the MOSFET, for gate electrode 57 and conductive film 11 electrically connected with p-type guard ring region 7, poly-Si or molybdenum Mo is preferably used. Accordingly, in addition to the above-described effects, the effect can be achieved that the number of process steps for manufacturing the semiconductor device can be reduced.

Particularly in the case where poly-Si is used for gate electrode 57 and conductive film 11 electrically connected with p-type guard ring region 7, the material can be easily embedded in contact hole 10. Thus, the inner diameter of the contact hole can be made smaller. The number of process steps for manufacturing the semiconductor device can be reduced accordingly. Further, even if the surface area of the semiconductor device is reduced, short circuit between conductive films due to a foreign matter or pattern defect can be prevented, since a predetermined distance in the normal direction between discrete portions 11A, 11A and a predetermined distance in the circumferential direction between discrete portions 11A, 11A are kept. Thus, a desired breakdown voltage characteristic of the semiconductor device can be ensured.

Here, molybdenum Mo having a low electrical conductivity can be used at high temperatures. Therefore, in the case where molybdenum Mo is used for gate electrode 57 and conductive film 11 electrically connected with p-type guard ring region 7, the following effect as described above can be achieved for the semiconductor device used at high temperatures. Namely, even if the surface area of the semiconductor device is reduced, short circuit between conductive films due to a foreign matter or pattern defect can be prevented, since a predetermined distance in the normal direction between discrete portions 11A, 11A and a predetermined distance in the circumferential direction between discrete portions 11A, 11A are kept. Thus, a desired breakdown voltage characteristic of the semiconductor device can be ensured.

While the description here is applied to the MOSFET as an example, the description is applicable to an IGBT having a similar gate electrode. In the case where any of the features and structures for the first embodiment as described above are applied to the semiconductor device here, similar functions and effects to the above-described ones can be achieved as well.

Second Embodiment

Figure 15:
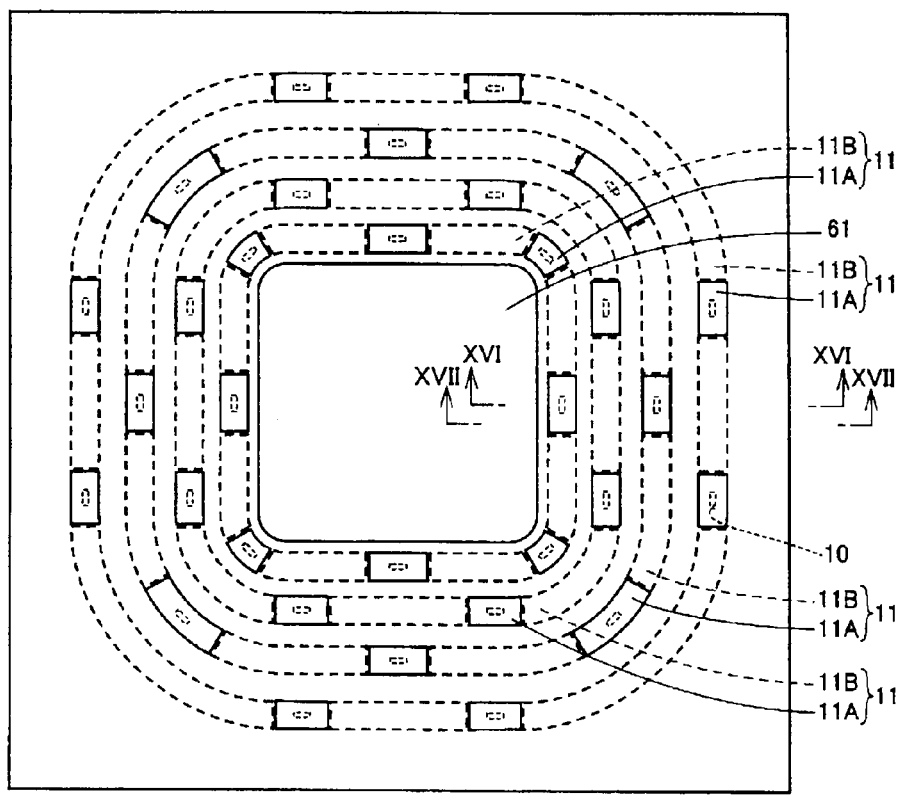
FIG. 15 is a plan view showing the whole structure of a semiconductor device according to a second embodiment.
Figure 16:
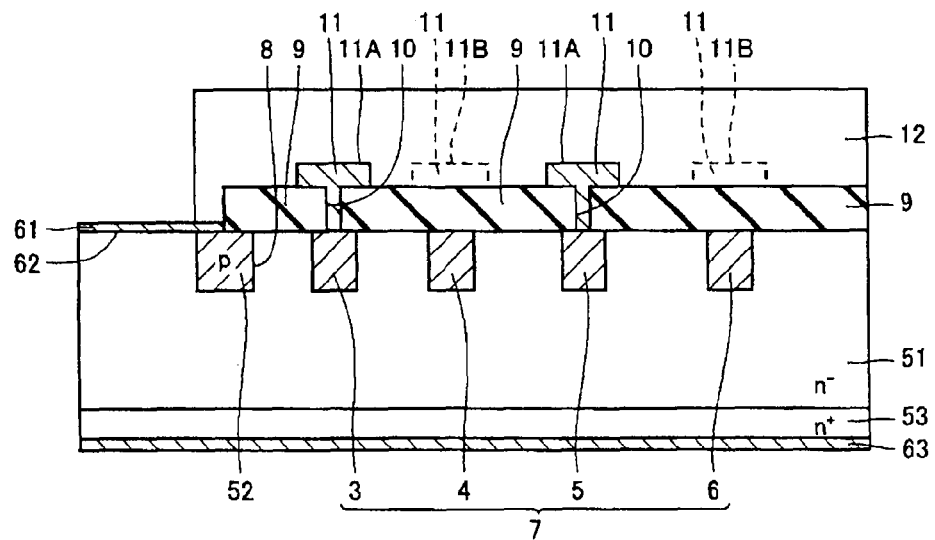
FIG. 16 is a cross section along an arrow-headed line XVI-XVI in FIG. 15.
Figure 17:
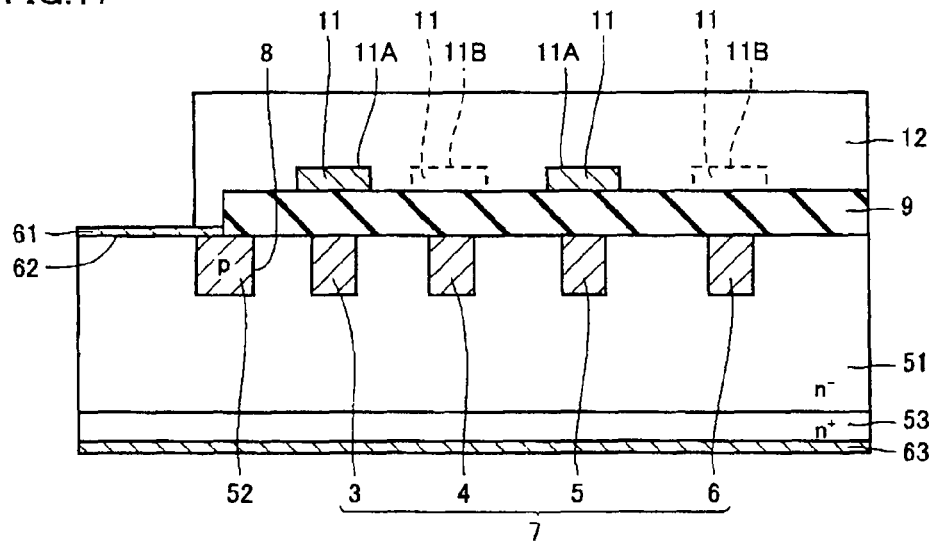
FIG. 17 is a cross section along an arrow-headed line XVII-XVII in FIG. 15.

Examples of the pn diode have been described above with reference to FIGS. 1 to 11, as examples of the semiconductor device according to the present invention. Referring now to FIGS. 15 to 17, examples of a semiconductor device keeping a predetermined voltage by a Schottky junction, namely Schottky barrier diode (hereinafter abbreviated as SBD) will be described, as examples of the structure of the semiconductor device according to a second embodiment.

Referring to FIGS. 15 to 17, a semiconductor device of the second embodiment chiefly includes a Schottky electrode 61 disposed at a position corresponding to anode electrode 13 of the above-described semiconductor device, namely at a position corresponding to a central region of a first main surface of an n-type semiconductor substrate 1 in the first embodiment. More specifically, the semiconductor device of the second embodiment includes Schottky electrode 61, a cathode electrode 63, an $n^-$-type semiconductor region 51, a p-type semiconductor region 52, and an $n^+$-type semiconductor region 53.

P-type semiconductor region 52 is located at a part of a main surface of $n^-$-type semiconductor region 51 to form an annular pn junction region 8 between $n^-$-type semiconductor region 51 and p-type semiconductor region 52. Schottky electrode 61 is disposed in contact with the main surface of $n^-$-type semiconductor region 51 as well as a part of a surface of p-type semiconductor region 52. Cathode electrode 63 is disposed in contact with $n^+$-type semiconductor region 53. Schottky electrode 61 forms a Schottky junction 62 between $n^-$-type semiconductor region 51 and Schottky electrode 61.

Like the first embodiment (FIG. 1), a plurality of p-type guard rings 3, 4, 5, 6 (p-type guard ring region 7) are disposed annularly in a peripheral region in the main surface of the semiconductor substrate. A high resistance conductive semi-insulating film 12 is further disposed on respective surfaces of an insulating film 9 and a conductive film 11 to cover these films. Insulating film 11 provided at each of respective positions between a plurality of p-type guard rings of p-type guard ring region 7 and semi-insulating film 12 is disposed to discontinuously extend along annular p-type guard ring region 7.

The specific structure of these components and other structures of the second embodiment are similar to those of the first embodiment (FIG. 1). Like components are denoted by like reference characters and the description thereof will not be repeated.

Functions and effects achieved when a voltage is applied to the semiconductor device with the above-described structure will be described. When a forward bias is applied to the semiconductor device with a polarity that Schottky electrode 61 is positive and cathode electrode 63 is negative, pn junction region 8 is forward-biased. Then, holes are injected as minority carriers from p-type semiconductor region 52 into $n^-$-type semiconductor region 51, while electrons are injected from cathode electrode 63 via $n^+$-type semiconductor region 53 into $n^-$-type semiconductor region 51. Accordingly, holes and a large number of electrons are contained in $n^-$-type semiconductor region 51.

Next, a reverse bias is applied to the semiconductor device with a polarity that Schottky electrode 61 is negative and cathode electrode 63 is positive, and pn junction region 8 is reverse-biased. Since $n^-$-type semiconductor region 51 has a higher specific resistance and a lower impurity concentration than p-type semiconductor region 52, a depletion layer extends from pn junction region 8 chiefly into $n^-$-type semiconductor region 51.

Thus, a desired breakdown voltage characteristic of the semiconductor device can be ensured. More specifically, p-type guard ring region 7 is disposed annularly without interruptions to surround pn junction region 8. Conductive film 11 electrically connected with p-type guard ring region 7 is disposed discontinuously and semi-insulating film 12 is disposed to cover conductive film 11 and insulating film 9.

In the structure as described above, when a voltage is applied, an electric field at respective surfaces of discrete portions 11A, 11A of conductive film 11 that are disposed discretely in the circumferential direction is uniform. A depletion layer thus uniformly extends in $n^-$-type semiconductor region 51. A desired breakdown voltage characteristic of the semiconductor device can thus be ensured. Even if the surface area of the semiconductor device is made smaller, discrete portions 11A, 11A are arranged at predetermined intervals in both of the normal direction and the circumferential direction, so that short-circuit between conductive films due to a foreign matter or pattern defect can be prevented and a desired breakdown voltage characteristic of the semiconductor device can be ensured.

Modifications of the Structure of Second Embodiment

For $n^-$-type semiconductor region 51, p-type semiconductor region 52 and $n^+$-type semiconductor region 53 that are constituent components of the semiconductor device in the second embodiment, silicon Si or silicon carbide SiC is preferably used. In particular, silicon carbide SiC is preferably used for these components.

An SBD for which silicon Si is used has a breakdown voltage characteristic of approximately 100 V or less. In contrast, an SBD for which silicon carbide SiC is used has a breakdown voltage characteristic of 600 V or more, for example. Therefore, the former SBD using silicon Si and the latter SBD using silicon carbide SiC are different from each other in terms of extension of a depletion layer. Specifically, the depletion layer in the latter SBD using silicon carbide SiC extends to a greater extent.

Accordingly, the intervals in the normal direction between guard rings in the guard ring region are larger in the SBD using silicon carbide SiC than those in the SBD using silicon Si. The surface area of the SBD using silicon carbide SiC is also larger than that of the SBD using silicon Si.

Therefore, in the case where the surface area of the SBD is to be reduced, the degree to which the surface area of the SBD is decreased by applying the present invention is larger for the SBD using silicon carbide SiC than that for the SBD using silicon Si. Thus, the effect achieved by the SBD using silicon carbide SiC is larger. As seen from above, it is more preferable to use silicon carbide SiC for $n^-$-type semiconductor region 51, p-type semiconductor region 52 and $n^+$-type semiconductor region 53 that are constituent components of the semiconductor device in the second embodiment.

For Schottky electrode 61 that is a constituent component of the semiconductor device in the second embodiment, titanium Ti, nickel Ni, gold Au or molybdenum Mo is preferably used. Silicon dioxide $SiO_2$ is preferably used for insulating film 9. For conductive film 11, aluminum Al, the same material as that used for Schottky electrode 61, or a laminated layer made of the same material as that used for Schottky electrode 61 and aluminum Al is preferably used. For semi-insulating film 12, a semi-insulating (high resistance and conductive) SiN is preferably used.

Figure 18:
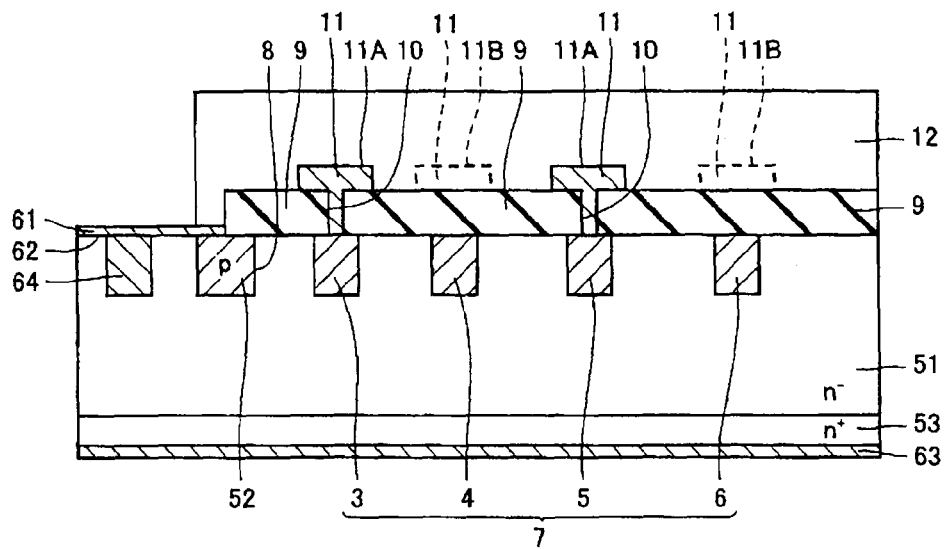
FIG. 18 is a cross section showing a structure where another p-type semiconductor region is used in a semiconductor device according to the second embodiment.
Figure 19:
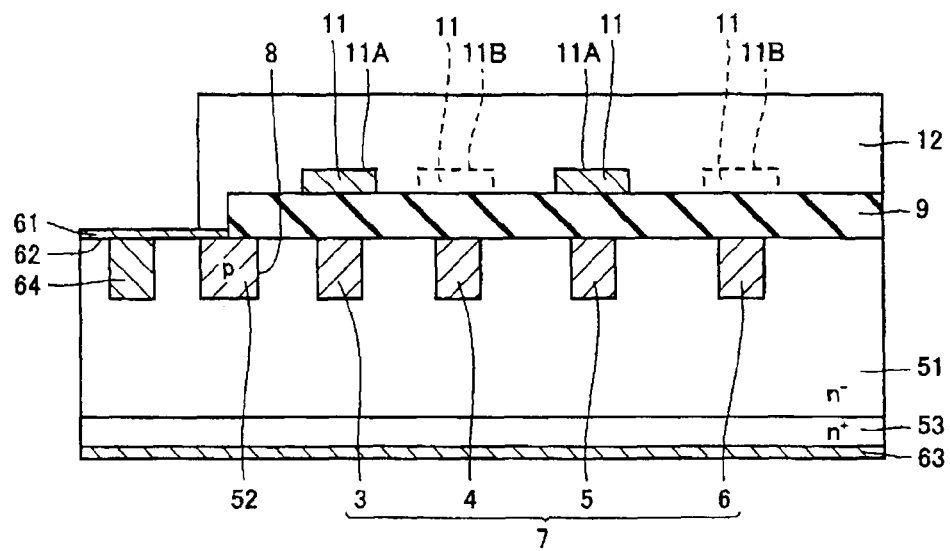
FIG. 19 is a cross section showing a structure where another p-type semiconductor region is used in a semiconductor device according to the second embodiment.
Figure 20:
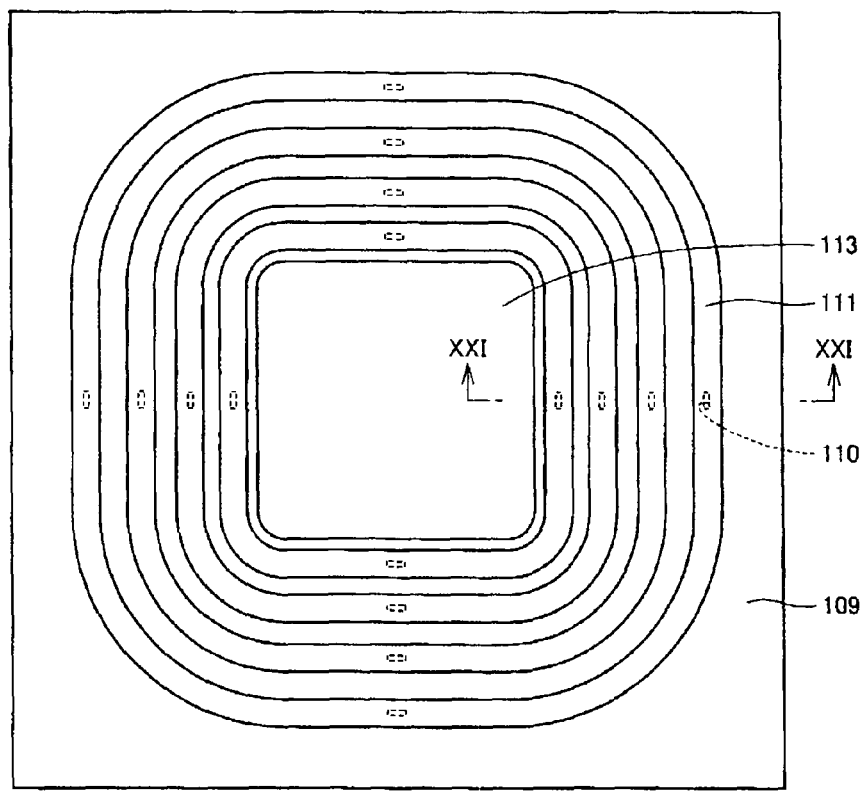
FIG. 20 is a plan view showing the whole structure of a conventional semiconductor device including a guard ring and keeping a predetermined voltage by a pn junction.
Figure 21:
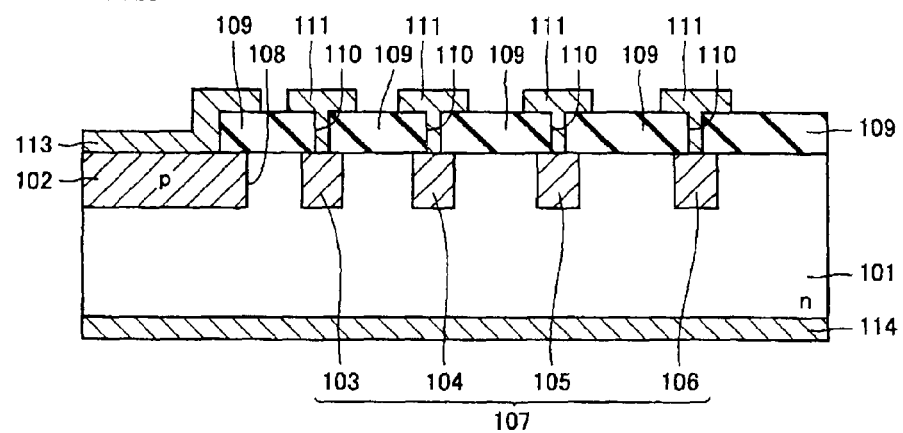
FIG. 21 is a cross section along an arrow-headed line XXI-XXI in FIG. 20.
Figure 22:
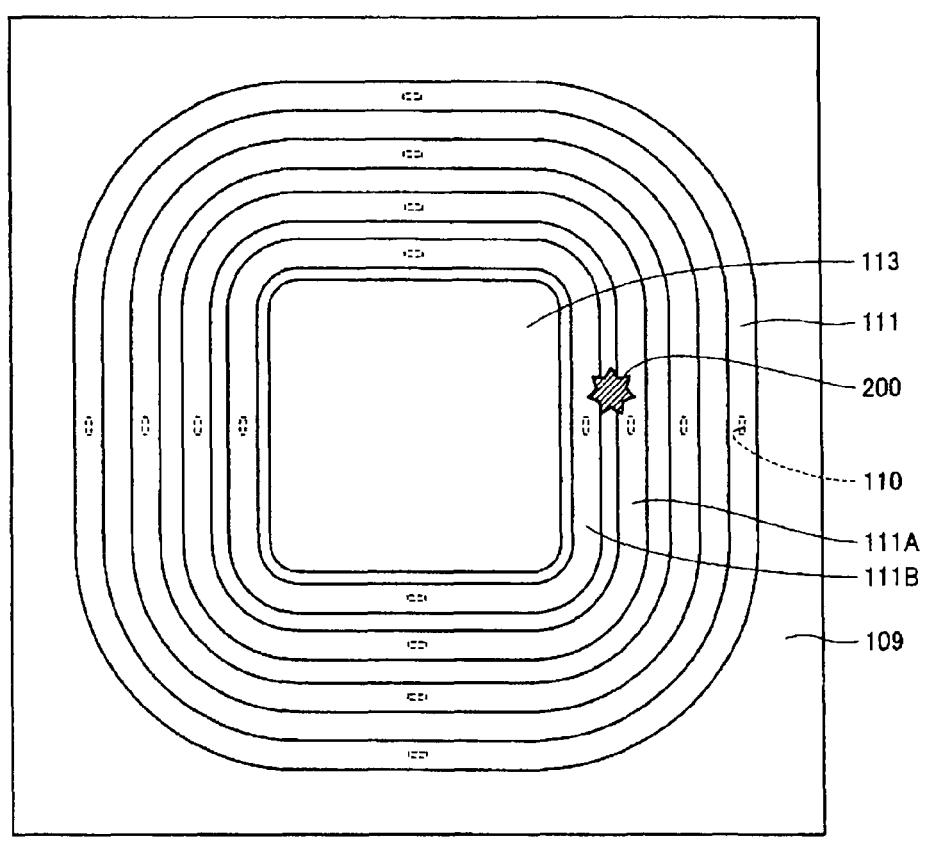
FIG. 22 is a plan view showing the conventional semiconductor device with a foreign matter adhering to a surface of the semiconductor device.

Referring to FIGS. 18 and 19, another p-type semiconductor region 64 that is in contact with Schottky electrode 61 and, together with Schottky electrode 61, forms Schottky junction 62 may be provided. P-type semiconductor region 52, p-type semiconductor region 64 and p-type guard ring region 7 may not necessary be p-type of the same impurity concentration, and may be p-type having respective impurity concentrations different from each other. Further, p-type semiconductor region 52, p-type semiconductor region 64 and p-type guard ring region 7 may not necessarily have the same depth, and may extend to different depths respectively. Under any of the conditions as described above, similar functions and effects to those as described above can be achieved.

Like the first embodiment (see FIG. 4), discrete portions 11A of conductive films 11 are preferably arranged in so-called zigzag manner. Under this condition as well, even if the surface area of the semiconductor device is made smaller, appropriate distances between discrete portions 11A, 11A of conductive films 11, 11 are maintained.

Specifically, in the structure as described above, a sufficient distance can be kept between discrete portion 11A of conductive film 11 disposed discontinuously along a first p-type guard ring and discrete portion 11A of conductive film 11 disposed discontinuously along a second p-type guard ring located adjacent to the first p-type guard ring. A sufficient distance can also be kept between discrete portion 11A of conductive film 11 disposed discontinuously along the first p-type guard ring and discrete portion 11A of conductive film 11 disposed discontinuously along a third p-type guard ring located opposite to the first p-type guard ring with respect to the p-type guard ring adjacent to the first guard ring.

Accordingly, short circuit between conductive films can be prevented that is caused by influences of such factors as a foreign matter attaching to a surface of the semiconductor device and a pattern defect that could occur due to a reduced surface area of the semiconductor device, and a desired breakdown voltage characteristic of the semiconductor device can be ensured.

Further, like the first embodiment (see FIG. 4), a minimum circumferential dimension Y of one interruption 11 BB among interruptions 11B of conductive films 11, 11 including discontinuous regions is preferably larger than a maximum distance X in the normal direction between conductive films 11L, 11R located opposite to each other in the normal direction with respect to interruption 11 BB.

In this structure, an appropriate distance between discrete portions 11A 11A of conductive films 11, 11 is maintained, and accordingly short circuit between conductive films 11, 11 can be prevented that is caused by influences of factors such as a foreign matter attaching to a surface of the semiconductor device and a pattern defect that is likely to occur due to a reduced surface area of the semiconductor device, and a desired breakdown voltage characteristic of the semiconductor device can be ensured.

Like the first embodiment, all conductive films 11 may be disposed discontinuously along p-type guard ring region 7. Alternatively, like the first embodiment, conductive films 11 located inside relative to the outermost p-type guard ring of p-type guard ring region 7 may be disposed discontinuously along respective guard rings located inside, while conductive film 11 located along the outermost p-type guard ring may be disposed continuously along this outermost p-type guard ring.

In the above-described structure, the distances between discrete portions 11A, 11A of conductive films 11, 11 are maintained like the first embodiment. Thus, short circuit between conductive films 11 due to a foreign matter or pattern defect can be prevented and a desired breakdown voltage characteristic of the semiconductor device can be ensured.

Further, like the first embodiment, the width in the normal direction of conductive film 11 disposed discontinuously along p-type guard ring region 7 is preferably smaller than the width in the normal direction of the p-type guard ring electrically connected with conductive film 11. In this structure, even if the surface area of the semiconductor device is reduced, uniform extension of the depletion layer can be achieved. Further, a larger distance in the normal direction between discrete portions 11A, 11A of conductive films 11, 11 and a larger distance in the circumferential direction between discrete portions 11A, 11A of conductive film 11 can be ensured. Accordingly, short circuit between conductive films 11 due to a foreign matter or pattern defect can be prevented more effectively, and a desired breakdown voltage characteristic of the semiconductor device can be ensured.

Furthermore, like the first embodiment, conductive film 11 disposed discontinuously along p-type guard ring region 7 is preferably provided in only the inside of contact hole 10 running in the thickness direction through insulating film 9. Namely, conductive film 11 may be embedded in contact hole 10. In this structure, uniform extension of the depletion layer can be achieved. Even if the surface area of the semiconductor device is reduced, a larger distance in the normal direction between discrete portions 11A, 11A of conductive films 11, 11 and a larger distance in the circumferential direction between discrete portions 11A, 11A of conductive film 11 can be ensured. Accordingly, short circuit between conductive films 11 due to a foreign matter or pattern defect can be prevented, and a desired breakdown voltage characteristic of the semiconductor device can be ensured.

Moreover, like the first embodiment, in the structure where conductive film 11 is embedded in contact hole 10 as described above, a feature may be applied that a W plug or poly-Si is embedded in contact hole 10. In this structure, uniform extension of the depletion layer can be achieved. Even if the surface area of the semiconductor device is reduced, a larger distance in the normal direction between discrete portions 11A, 11A of conductive films 11, 11 and a larger distance in the circumferential direction between discrete portions 11A, 11A of conductive film 11 can be ensured. Accordingly, short circuit between conductive films 11 due to a foreign matter or pattern defect can be prevented, and a desired breakdown voltage characteristic of the semiconductor device can be ensured.

In addition, like the first embodiment, the structure in which a W plug or poly-Si is embedded in the contact hole may be applied to a structure in which conductive film 11 is disposed to protrude from the surface of insulating film 9. This structure can provide similar functions and effects to the above-described ones.

Further, like the first embodiment, while the first conductivity type is n-type and the second conductivity type is p-type according to the description above, similar functions and effects to the above-described ones can be achieved even if the first conductivity type is p-type and the second conductivity type is n-type. Further, p-type semiconductor region 52 and p-type guard ring region 7 may not p-type of the same impurity concentration, and may be p-type of different concentrations respectively. Furthermore, p-type semiconductor region 52 and p-type guard ring region 7 may not extend to the same depth and may extend to different depths respectively. Under any of these conditions of the structure, similar functions and effects to the above-described ones can be achieved.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device comprising:
a semiconductor substrate of a first conductivity type;
an impurity diffusion region of a second conductivity type disposed to extend to a predetermined depth from a first main surface of said semiconductor substrate toward a second main surface of said semiconductor substrate, an annular junction region being formed between said impurity diffusion region and said semiconductor substrate;
a plurality of annular guard rings of the second conductivity type disposed at said first main surface of said semiconductor substrate to surround said annular junction region and to be spaced from each other by a predetermined distance in a normal direction;
a first interlayer insulating film disposed to cover said first main surface of said semiconductor substrate;
one or more conductive films disposed to extend in one or more contact holes running in a thickness direction through said first interlayer insulating film, said one or more conductive films being electrically connected with said annular guard rings of the second conductivity type; and
a second interlayer insulating film disposed to cover said first interlayer insulating film and said one or more conductive films, said second interlayer insulating film being of a semi-insulating material, wherein
each of said one or more conductive films including a discontinuous region, each of the one or more conductive films being located between one of said plurality of annular guard rings and said second interlayer insulating film, and being disposed along said one of the annular guard rings, and
said discontinuous region including one or more discrete portions where a respective one of the conductive films is present and one or more interruptions where the respective one of the conductive films is absent.

2. The semiconductor device according to claim 1, wherein
said semiconductor substrate is of n-type,
said impurity diffusion region is of p-type,
said annular junction region forms a pn junction, and
the semiconductor device keeps an applied voltage by said pn junction.

3. The semiconductor device according to claim 2, wherein one of silicon and silicon carbide is used for said semiconductor substrate.

4. The semiconductor device according to claim 1, wherein
a field effect transistor having a gate electrode is formed at said first main surface of said semiconductor substrate, and
poly-Si is used for said gate electrode and said one or more conductive films electrically connected with said annular guard rings.

5. The semiconductor device according to claim 1, wherein
a field effect transistor having a gate electrode is formed at said first main surface of said semiconductor substrate, and
Mo is used for said gate electrode and said one or more conductive films electrically connected with said annular guard rings.

6. The semiconductor device according to claim 1, wherein
said semiconductor substrate is of n-type,
said impurity diffusion region is of p-type,
the semiconductor device keeps an applied voltage by a Schottky junction disposed at said semiconductor substrate, and
said annular junction region is disposed to surround said Schottky junction.

7. The semiconductor device according to claim 6, wherein silicon carbide is used for said semiconductor substrate.

8. The semiconductor device according to claim 1, wherein said first interlayer insulating film is of silicon dioxide, and said second interlayer insulating film is of semi-insulating silicon nitride.

9. The semiconductor device according to claim 8, wherein said silicon nitride has an electrical conductivity [$(1/\Omega)$ cm] of not more than $1\times10^{-13}$ at room temperature and not less than $1\times10^{-12}$ at 110° C.

10. The semiconductor device according to claim 1, wherein a maximum circumferential dimension of a projected shape formed by projecting, in the normal direction, one discrete portion of said one or more discrete portions of a first conductive film of said conductive films including said discontinuous region, on a second conductive film of said conductive films that is adjacent to said first conductive film in the normal direction and includes said discontinuous region, is included in a minimum circumferential dimension of one interruption of said one or more interruptions of said second conductive film.

11. The semiconductor device according to claim 1, wherein a minimum circumferential dimension of one interruption of said one or more interruptions of one of said conductive films including said discontinuous region is larger than a maximum distance in the normal direction between conductive films opposite to each other in the normal direction with respect to said one interruption.

12. The semiconductor device according to claim 1, wherein said conductive films including said discontinuous region disposed along said annular guard rings are all disposed discontinuously along said annular guard rings.

13. The semiconductor device according to claim 1, wherein said conductive films including said discontinuous region disposed along said annular guard rings include
a conductive film located between an outermost one of said annular guard rings and said second interlayer insulating film and disposed continuously along said outermost guard ring, and
a conductive film located inside said outermost guard ring and disposed discontinuously along said annular guard rings.

14. The semiconductor device according to claim 1, wherein a width in the normal direction of one of said conductive films is smaller than a width in the normal direction of one of said annular guard rings that is electrically connected with said one of said conductive films.

15. The semiconductor device according to claim 1, wherein said one or more conductive films are disposed to extend only in said one or more contact holes running in the thickness direction through said first interlayer insulating film.

16. The semiconductor device according to claim 1, wherein said one or more conductive films include a W plug in said one or more contact holes, and are electrically connected with said annular guard rings through said W plug.

17. The semiconductor device according to claim 1, wherein each of the plurality of annular guard rings comprises a diffusion region of the second conductivity type extending to a predetermined depth below the first main surface of the semiconductor substrate toward the second main surface of the semiconductor substrate.

18. The semiconductor device according to claim 1, wherein the plurality of annular guard rings includes at least three annular guard rings.

19. The semiconductor device according to claim 1, wherein adjacent conductive films are spaced from each other by a predetermined distance in the normal direction.

* * * * *